United States Patent
Watanabe

(10) Patent No.: US 7,326,946 B2
(45) Date of Patent: Feb. 5, 2008

(54) OPTICAL MODULE HAVING A REFLECTOR ELEMENT AND METHOD OF MANUFACTURING THE SAME

(75) Inventor: Kazuyoshi Watanabe, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 11/148,327

(22) Filed: Jun. 9, 2005

(65) Prior Publication Data
US 2005/0274877 A1 Dec. 15, 2005

(30) Foreign Application Priority Data
Jun. 11, 2004 (JP) .............................. 2004-174804

(51) Int. Cl.
*G02B 27/00* (2006.01)
(52) U.S. Cl. ..................................................... 250/551
(58) Field of Classification Search ................ 250/551, 250/239, 216; 257/80–92
See application file for complete search history.

(56) References Cited

U.S. PATENT DOCUMENTS

| | | | | |
|---|---|---|---|---|
| 4,650,988 A | * | 3/1987 | Suzuki et al. ............... | 250/216 |
| 4,854,659 A | * | 8/1989 | Hamerslag et al. ........... | 385/14 |
| 5,168,217 A | * | 12/1992 | Sakaguchi .................. | 324/537 |
| 5,621,218 A | * | 4/1997 | Tanaka .................... | 250/559.34 |
| 5,655,357 A | * | 8/1997 | Kristen ........................ | 53/512 |
| 5,768,938 A | * | 6/1998 | Schilling et al. .............. | 73/160 |

FOREIGN PATENT DOCUMENTS

| | | |
|---|---|---|
| JP | 5-175614 | 7/1993 |
| JP | 10-321900 | 12/1998 |
| JP | 11-238900 | 8/1999 |
| JP | 2004118081 A * | 4/2004 |

* cited by examiner

*Primary Examiner*—Thanh X Luu
(74) *Attorney, Agent, or Firm*—Westerman, Hattori, Daniels & Adrian, LLP.

(57) ABSTRACT

An optical module includes a light-emitting element, a light-receiving element, and a reflector. The light-emitting element and the light-receiving element are mounted in the optical module, and the reflector composed of a wire or a ribbon reflects and guides an emitted light to a light-receiving surface.

14 Claims, 8 Drawing Sheets

FIG. 3A
FIG. 3B
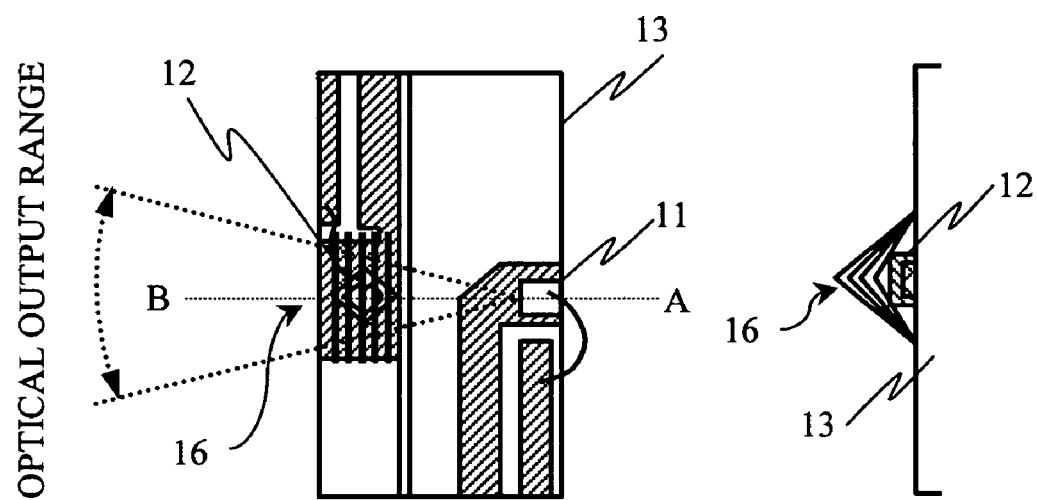
FIG. 3C
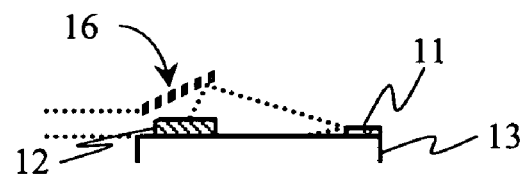

FIG. 4A
FIG. 4B
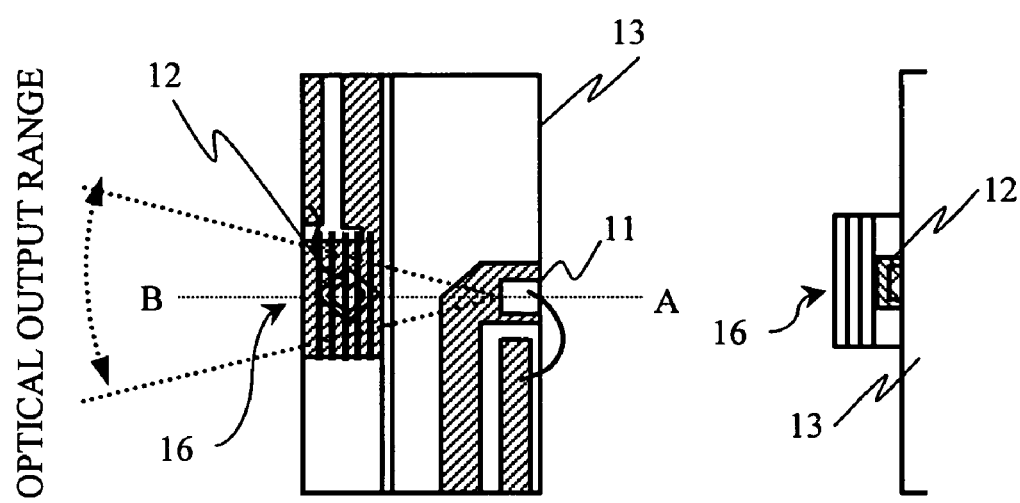
FIG. 4C
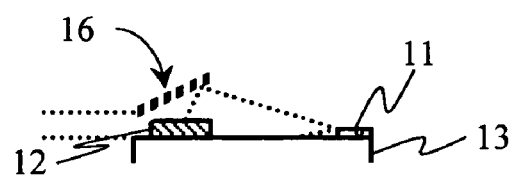

OPTICAL MODULE HAVING A REFLECTOR ELEMENT AND METHOD OF MANUFACTURING THE SAME

BACKGROUND OF THE INVENTION

1. Field of the Invention

This invention generally relates to optical modules and methods of manufacturing the same, and more particularly, to an optical module including an edge-emitting laser diode and a light-receiving element mounted on the same substrate and a method of manufacturing the same. The light-receiving element has an incident surface, and monitors an optical output from the edge-emitting laser diode.

2. Description of the Related Art

A conventional optical module includes an edge-emitting laser diode (hereinafter simply referred to as LD) and a light-receiving element having an incident surface mounted on different carriers, because the light-receiving element receives light with the incident surface thereof so as to monitor the characteristics such as the optical outputs from the LD.

FIGS. 1A and 1B schematically show a configuration example of the conventional optical module. More particularly, FIG. 1A is a top view of the conventional optical module, and FIG. 1B is a cross-sectional view thereof. In FIGS. 1A and 1B, a reference numeral 101 is an edge-emitting LD and a reference numeral 108 is a light-receiving element having the incident surface. A backside of the LD 101 is secured to an interconnection 104a provided on a platform substrate 103. A side face of a chip carrier 102 has the light-receiving element 108 on a main surface thereof, and is secured to an interconnection 104b provided on a substrate 105. An interconnection 106a and the LD 101 are provided on the platform substrate 103, and are connected by a bonding wire 107a. An interconnection 106b and the chip carrier 102 are provided on the substrate 105, and are connected by a bonding wire 107b. The chip carrier 102 includes an interconnection, not shown, connected to the light-receiving element 108.

In the assembly process of the conventional optical module, the light-receiving element 108 is mounted on the chip carrier 102 first (a first mounting) so that a light-receiving surface of the light-receiving element 108 can receive laser light emitted from a light-emitting surface of the LD 101 effectively. Then, the chip carrier 102 and the platform substrate 103 are mounted on the substrate 105 (a second mounting). The above assembly process is complicated. In addition, there are the following problems. The conventional optical module requires two support members of the platform substrate 103 and the chip carrier 102. The optical module does not have an accurate position alignment because the light-receiving element 108 is mounted through two separate mounting processes.

There are known the following techniques of producing the module having the light-emitting element and the light-receiving element mounted on the substrate thereof. First, Japanese Patent Application Publication No. 5-175614 (hereinafter, referred to as Document 1) discloses an optical semiconductor device having a reflecting optical member such as a reflecting mirror. The optical semiconductor device disclosed in Document 1 includes the light-emitting element and the light-receiving element, the mounting surfaces of which are arranged in parallel with each other. The reflecting mirror reflects the light emitting in parallel with the mounting surfaces from a rear edge of the light-emitting element, and guides the emitted light to the light-receiving element. Document 1 proposes that the aforementioned configuration makes it possible to facilitate the production and provide a low-cost optical semiconductor device.

Additionally, Japanese Patent Application Publication No. 10-321900 (hereinafter, referred to as Document 2) discloses an optical module, in which the light-emitting element and the light-receiving element mounted on the substrate are sealed with a plastic to form a single unit, the plastic being substantially transparent to the wavelength of the light emitted from the light-emitting element. The optical module disclosed in Document 2 includes a reflecting means provided in a region of the plastic surface, the region being deviated from the light axis of the light-emitting element, to reflect the leaked lights to the light-receiving element, while the lights are being emitted from the light-emitting element. The reflecting means in the optical module having the above-mentioned configuration is provided in the region of the plastic surface, the region being deviated from the light axis of the light-emitting element, and reflects and monitors only the unnecessary leaked lights while the lights are being emitted from the light-emitting element to the light-receiving element.

Further, Japanese Patent Application Publication No. 11-238900 (hereinafter, referred to as Document 3) describes an optical module including a base body having a first element mounting portion and a second element mounting portion on a main surface thereof, a light-emitting element, and a light-receiving element. The base body has the first element mounting portion arranged adjacently to an edge of the optical fiber supporting portion and the second element mounting portion arranged adjacently to the first element mounting portion. The light-emitting element is mounted on the first element mounting portion, facing the edge of the optical fiber, and has a first edge that optically couples with the edge of the optical fiber. The light-receiving element has a surface for receiving the light, and is mounted on the second element mounting portion, facing the main surface of the light incident surface. A concave portion is provided on the base body so as to guide the light emitted from the light-emitting element to the light incident surface of the light-receiving element. The light-receiving element is mounted to partially cover the concave portion of the light incident surface. Thus configured concave portion is capable of enhancing the optical coupling efficiency, and in addition, the optical module can be downsized.

It is to be noted that the optical semiconductor device described in Document 1 has to provide the optical window portion so as to make use of the emitted light of the light-emitting element on the outside, and this increases the number of the component members. In addition, the chassis for providing the optical window portion has to be processed to have a special shape. The optical module described in Document 2 has a prior condition that the module is integrated with the transparent plastic so as to mount the light-emitting element having the light-emitting surface and the light-receiving element having the light incident surface. This limits the flexibility in the structure. The optical module described in Document 3 includes the concave portion on the platform substrate. However, if silicon, for example, is used for the platform substance, the difference in the etching rates of the surface orientations is utilized with the KOH solution as an etchant. A production process is required so that the concave portion is formed with the use of the (111) surface that has a slow etching rate. As described above, there are problems in that the production process is complicated, the extra component member is required, and accordingly, the production cost is increased in the conventional techniques.

SUMMARY OF THE INVENTION

The present invention has been made in view of the above circumstances and has a general object is to provide a low-cost module including a LD and a light-receiving element having an incident surface that monitors an optical output from the LD, both of the LD and the light-receiving element being mounted on a same substrate. This object of the present invention is achieved without increasing the number of production processes or the number of component members.

According to one aspect of the present invention, preferably, there is provided an optical module including a light-emitting element, a light-receiving element, and a reflector composed of a wire or a ribbon, the light-emitting element and the light-receiving element being mounted in the optical module, the reflector reflecting and guiding an emitted light to a light-receiving surface.

According to another aspect of the present invention, preferably, there is provided a method of manufacturing an optical module including mounting a light-emitting element and a light-receiving element in the optical module, and forming a reflector by bonding a ribbon or a wire so that a light emitted from the light-emitting element may be reflected thereon and guided to a light-receiving surface of the light-receiving element.

BRIEF DESCRIPTION OF THE DRAWINGS

Preferred embodiments of the present invention will be described in detail with reference to the following drawings, wherein:

FIGS. 3A through 3C show one example of a "dogleg"-shaped reflector provided in the optical module of the present invention;

FIGS. 4A through 4C show another example of a "U"-shaped reflector provided in the optical module of the present invention;

DESCRIPTION OF THE PREFERRED EMBODIMENTS

A description will now be given, with reference to the accompanying drawings, of embodiments of the present invention.

Figure 1A:
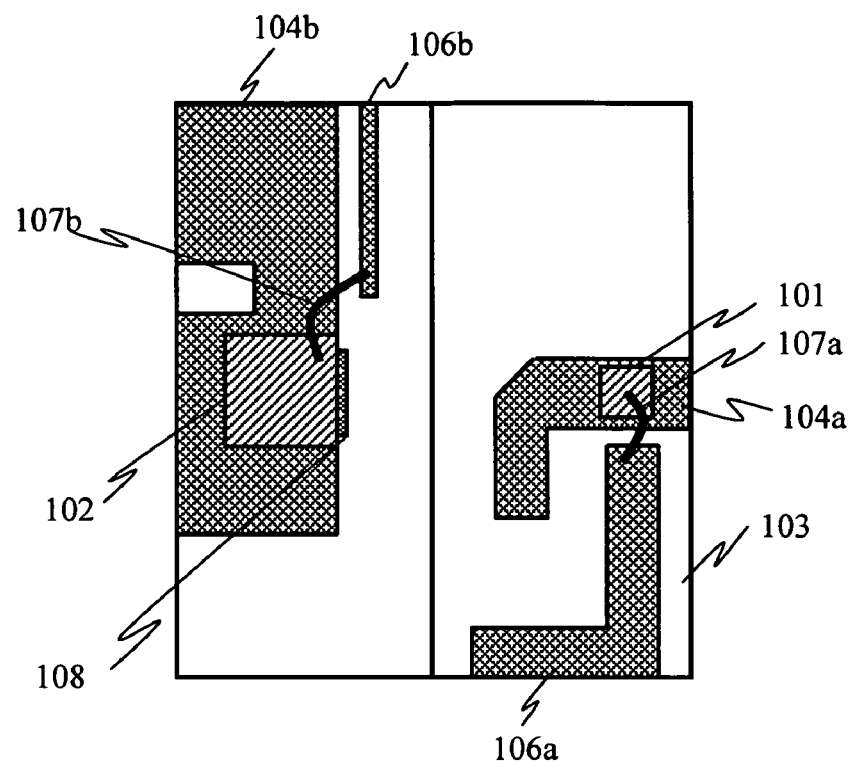
FIGS. 1A and 1B schematically show a configuration example of a conventional optical module.
Figure 1B:
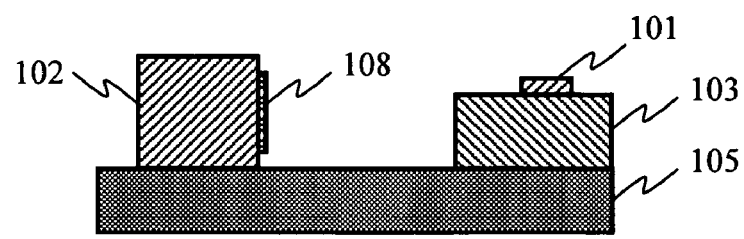
Figure 2A:
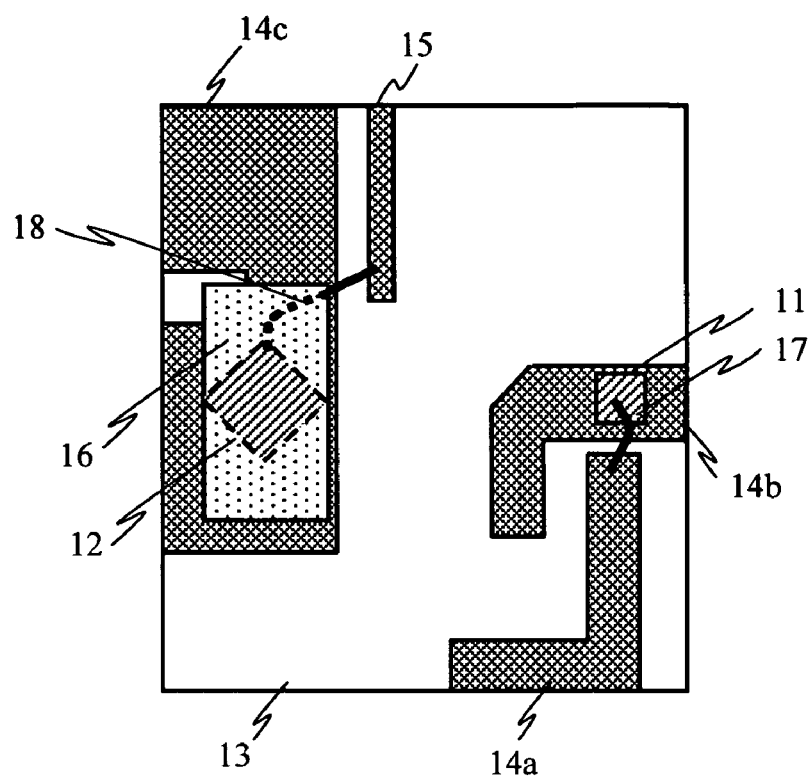
FIGS. 2A and 2B schematically show a configuration example of an optical module of the present invention.
Figure 2B:
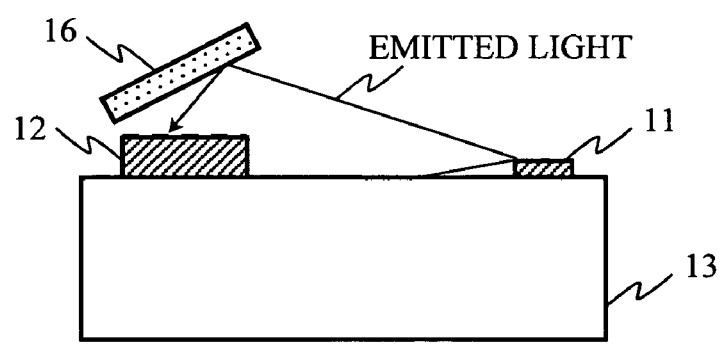

FIGS. 2A and 2B schematically show a configuration example of an optical module of the present invention. More particularly, FIG. 2A is a top view of this optical module, and FIG. 2B is a cross-sectional view thereof. In FIGS. 2A and 2B, a reference numeral 11 is an edge-emitting LD, a reference numeral 12 is a light-receiving element having an incident surface (a light-receiving surface), and a reference numeral 13 is a platform substrate on which the LD 11 and the light-receiving element 12 are mounted. Interconnections 14a through 14c and 15 used to drive the LD 11 and the light-receiving element 12 are formed on a main surface of the platform substrate 13. The interconnection 14b provided on the platform substrate 13 is secured to a given place of a backside of the LD 11. The light-receiving element 12 is arranged backward of an edge of the LD 11 with a light-receiving surface that faces upward so that the light-receiving element 12 can monitor the laser light emitted from the edge of the LD 11. A reflector 16 is provided above the light-receiving element 12 so as to reflect the laser light emitted from the edge of the LD 11 and guide the emitted light to a light-receiving portion of the light-receiving element 12. The LD 11 is connected to the interconnection 14a by a bonding wire 17, and the light-receiving element 12 is connected to the interconnection 15 by a bonding wire 18.

The reflector 16 may not be limited to a specific shape but may have various shapes capable of reflecting the light and guiding the light to the light-receiving element 12 at a high efficiency. The shape of the reflector 16 varies depending on the emitting profile of the laser light emitted from the edge of the LD 11, and also varies depending on the position and size of the light-receiving portion of the light-receiving element 12. For example, the reflector 16 may have a shape of "overhead roof", "dome", "dogleg", or "U". More particularly, the shape of "overhead roof" denotes a reflector mainly having a flat surface. The shape of "dome" denotes the reflector having a continuously curved surface. The shape of the "dogleg" denotes a plate-shaped reflector that bends at one point. The shape of the "U" denotes a plate-shaped reflector that bends at two points. The reflector 16 is available by forming a metal of a high optical reflectance, such as Au, Ni, Al, Cu, or the like, into a desired shape. The reflector 16 thus formed may be secured to the platform substrate 13. By way of another example, metal ribbons or wires are secured to the platform substrate 13 by a wire-bonding apparatus so as to form a desired shape of the reflector 16. The reflector 16 may be formed by covering the whole light-receiving element 12 with resin to have a desired shape.

A description will be given of the shape of the reflector employed in the optical module of the present invention in detail, as embodiments.

First Embodiment

FIGS. 3A through 3C show the first example of the reflector 16 having the "dogleg" shape included in the optical module of the present invention. More particularly, FIG. 3A is a top view of the dogleg-shaped reflector 16, and FIG. 3B is a front view seen from the LD 11. FIG. 3C is a cross-sectional view taken along a line A-B shown in FIG. 3A.

Referring to FIGS. 3A through 3C, the LD 11 and the light-receiving element 12 are arranged at given places on the platform substrate 13. The reflector 16 protrudes from sides of the light-receiving element 12 like the "dogleg" shape, and is provided above a top surface of the light-receiving element 12 (the light-receiving surface). The reflector 16 is available by forming a metal having a high optical reflectance such as Au, Ni, Al, Cu, or the like into the "dogleg" shape. The reflector 16 is secured to the platform substrate 13. The reflector 16 may be composed of multiple metal ribbons (including a foil into which thin wires are sewn) or wires. One end of each ribbon or wire is secured to the platform substrate 13 by the wire-bonding apparatus. Next, the ribbon or wire is processed so that the reflector 16 may cover a front surface of the light-receiving surface of the light-receiving element 12, and the reflector 16 may be bent like the "dogleg" shape so that the laser light emitted from the LD 11 may be received by the light-receiving surface. In this process, the multiple wires or ribbons are formed so as to gradually become lower in height as arranged further from a light-emitting element. Then, the other end of each ribbon or wire is be secured to the platform substrate 13 by the wire-bonding apparatus. The "dogleg"-shaped reflector 16 is bent at the top so as to have a triangle shape, in which the top is aligned with an axis that connects the light-emitting surface of the LD 11 and the light-receiving surface of the light-receiving element 12. The "dogleg"-shaped reflector 16 can efficiently gather the light emitted from the LD 11.

Second Embodiment

FIGS. 4A through 4C show the second example of the reflector 16 having the "U" shape that may be used in the optical module of the present invention. More particularly, FIG. 4A is a top view of the reflector 16, and FIG. 4B is a front view seen from the LD, FIG. 4C being a cross-sectional view taken along a line A-B shown in FIG. 4A.

Referring to FIGS. 4A through 4C, the LD 11 and the light-receiving element 12 are arranged at given places on the platform substrate 13. The reflector 16 protrudes from sides of the light-receiving element 12 so as to form a "U" shape, and is provided above a top surface of the light-receiving element 12 (the light-receiving surface). The reflector 16 is available by forming a metal having a high optical reflectance such as Au, Ni, Al, Cu, or the like into the "U" shape. The reflector 16 is secured to the platform substrate 13 as follows. One end of each metal ribbon (including a foil into which thin wires are sewn) or wire is secured to the platform substrate 13 by the wire-bonding apparatus. Next, the ribbon or wire is processed so that the reflector 16 may cover the front surface of the light-receiving surface of the light-receiving element 12, and the reflector 16 may be bent like the "U" shape so that the laser light emitted from the LD 11 may be received by the light-receiving surface. In this process, the multiple wires or ribbons are formed so as to gradually become lower in height as arranged further from the light-emitting element. Then, the other end of each metal ribbon or wire is secured to the platform substrate 13 by the wire-bonding apparatus. If the top of the reflector having the dogleg shape shown in FIGS. 3A through 3C is deviated from the axis that connects the light-emitting surface of the LD 11 and the light-receiving surface of the light-receiving element 12, the light will be obliquely gathered on the light-receiving surface. In contrast, the "U"-shaped reflector 16 is shaped so as to have the reflection surface that is partially parallel to the axis and has a box shape. Thus, and there are small variations in gathering the light, as compared to a case where the top of the "dogleg"-shaped reflector shown in FIGS. 3A through 3C is deviated.

Third Embodiment

Figure 5A:
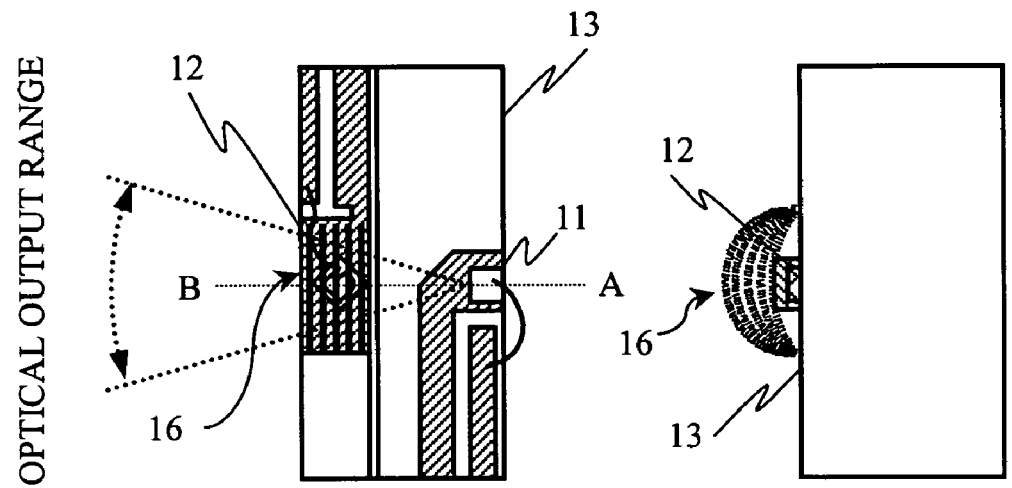
FIGS. 5A through 5C show another example of a "dome"-shaped reflector provided in the optical module of the present invention.
Figure 5B:
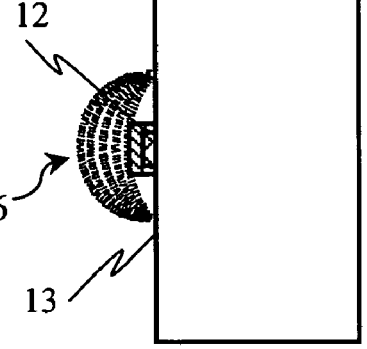
Figure 5C:
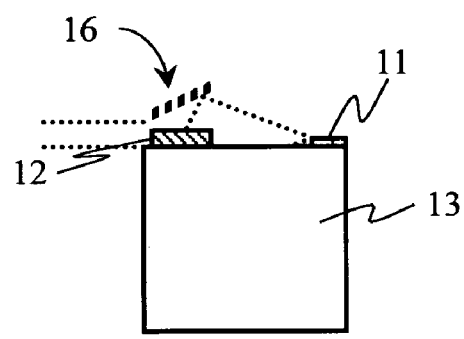

FIGS. 5A through 5C show the third example of the reflector 16 having the "dome" shape included in the optical module of the present invention. More particularly, FIG. 5A is a top view of the "dome"-shaped reflector 16, FIG. 5B is a front view seen from the LD 11, and FIG. 5C is a cross-sectional view taken along a line A-B shown in FIG. 5A.

Referring to FIGS. 5A through 5C, the LD 11 and the light-receiving element 12 are arranged at given places on the platform substrate 13. The reflector 16 protrudes from sides of the light-receiving element 12 so as to have the "dome" shape, and is provided above a top surface of the light-receiving element 12 (the light-receiving surface).

The reflector 16 is available by forming a metal having a high optical reflectance such as Au, Ni, Al, Cu, or the like into the "dome" shape. The reflector 16 is secured to the platform substrate 13 as follows. One end of each metal ribbon (including a foil into which thin wires are sewn) or wire is secured to the platform substrate 13 by the wire-bonding apparatus. Next, the ribbon or wire is processed so that the reflector 16 may cover a front surface of the light-receiving surface of the light-receiving element 12, and the reflector 16 may be curled like the "dome" shape so that the laser light emitted from the LD 11 may be received by the light-receiving surface. In this process, the multiple wires or ribbons are formed so as to gradually become lower in height as arranged further from the light-emitting element. Then, the other end of each ribbon or wire is secured to the platform substrate 13 by the wire-bonding apparatus. The "dome"-shaped reflector 16 can easily gather the emitted light on the light-receiving surface, as those in accordance with the first embodiment in FIGS. 3A through 3C.

Fourth Embodiment

Figure 6A:
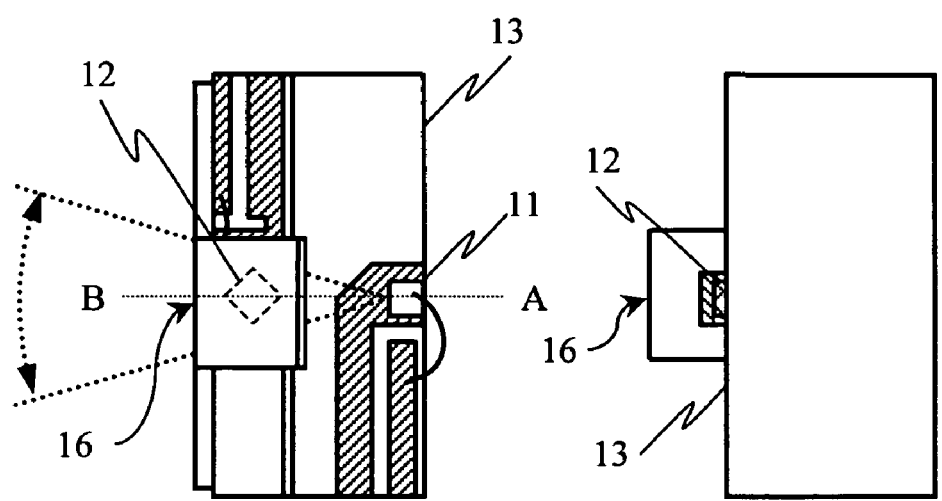
FIGS. 6A through 6C show another example of a metal reflector, which has been produced in advance, secured to a platform substrate in the optical module of the present invention.
Figure 6B:
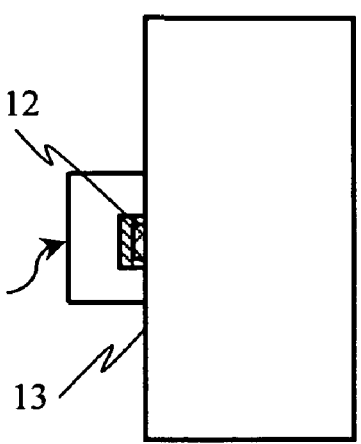
Figure 6C:
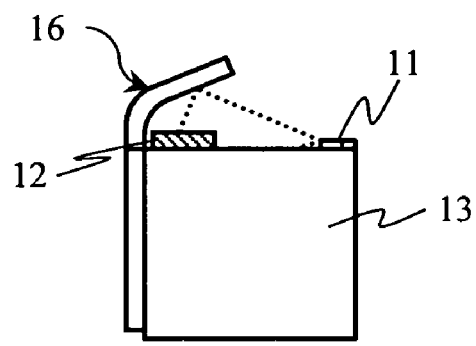

FIGS. 6A through 6C show the fourth example of the metal reflector 16, which has been produced in advance, secured to the platform substrate 13 included in the optical module of the present invention. More particularly, FIG. 6A is a top view of this type of reflector 16, FIG. 6B is a front view seen from the LD 11, and FIG. 6C is a side view of the reflector 16.

The LD 11 and the light-receiving element 12 are arranged at given places on the platform substrate 13. The reflector 16 is prepared prior to mounting (by press working, for example), and is provided to cover the top surface (the light-receiving surface) of the light-receiving element 12 like an "overhead roof". The reflector 16 is available by forming a metal having a high optical reflectance such as Au, Ni, Al, Cu, or the like into a desired shape. Then, the reflector 16 is secured to the platform substrate 13.

Figure 7A:
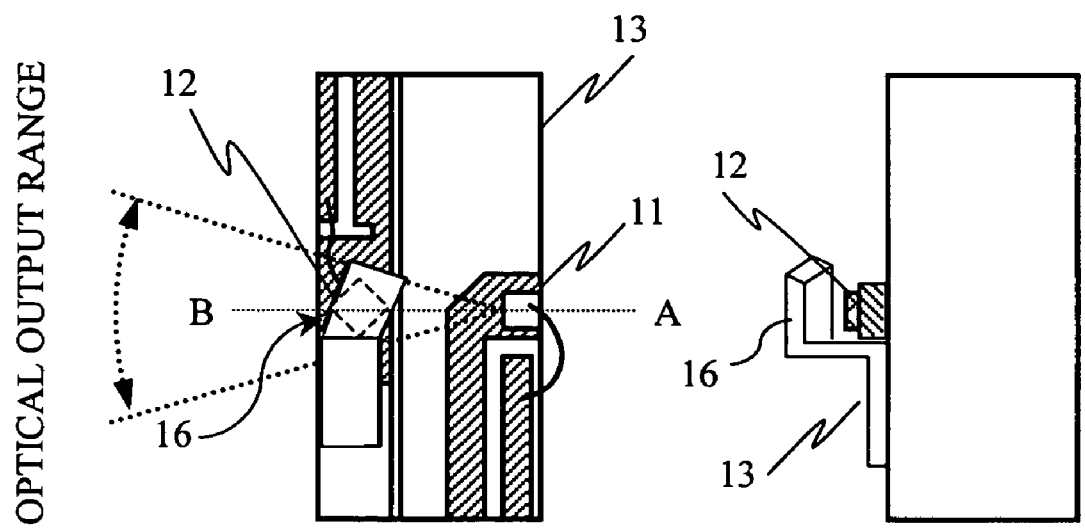
FIGS. 7A through 7C show another example of the metal reflector, which has been produced in advance, secured to the platform substrate in the optical module of the present invention.
Figure 7B:
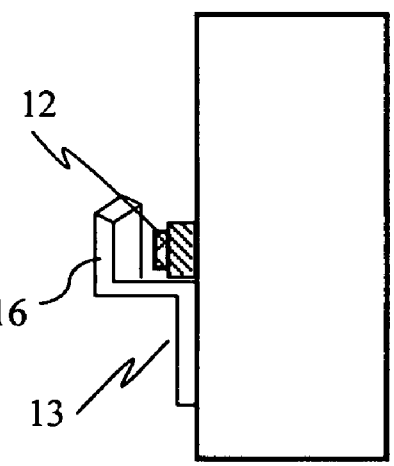
Figure 7C:
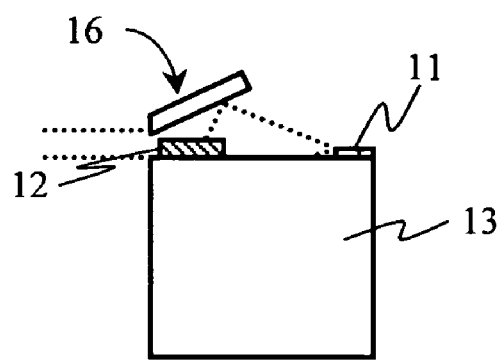

The shape of the metal reflector 16 may be changed as necessary and secured to a side face of the platform substrate 13 to cover the top surface of the light-receiving element 12 like the "overhead roof", as shown in FIGS. 6A through 6C. Also, the reflector 16 may be secured to the main surface of the platform substrate 13 to cover the top surface of the light-receiving element 12, as shown in FIG. 7A through 7C. Here, FIG. 7A is a top view, FIG. 7B is a front view seen from the LD side, and FIG. 7C is a cross-sectional view taken along a line A-B shown in FIG. 7A.

Other Embodiments

The platform substrate 13 is not limited to the flat main surface (mounting surface) described before but may have arbitrary shapes. For example, the main surface may have a step between a region for arranging the LD 11 and another region for arranging the light-receiving element 12. For instance, the light-receiving surface of the light-receiving element 12 may be positioned at a lower level than the LD 11. Moreover, the region for arranging the LD 11 and the region for arranging the light-receiving element 12 may be tilted to each other. In other words, an angle formed by a mounting surface of the LD 11 and the mounting surface of the light-receiving element 12 may be less than 180 degrees.

Figure 8A:
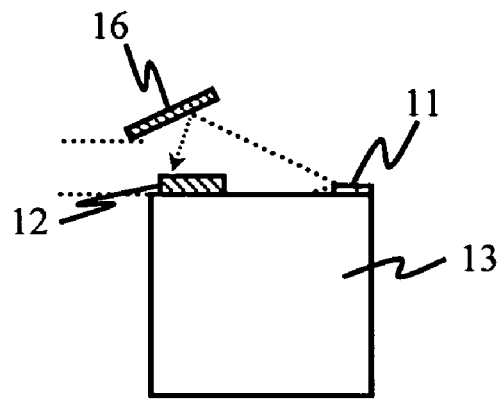
FIGS. 8A through 8C are views illustrating an example of a main surface shape of the platform substrate.
Figure 8B:
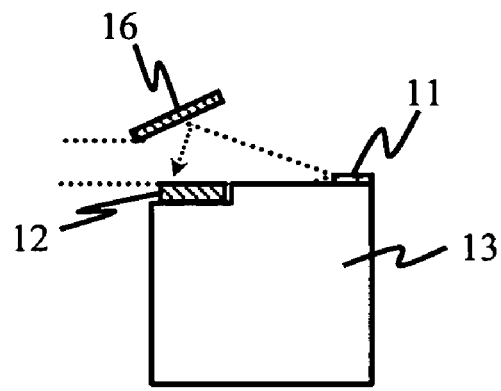
Figure 8C:
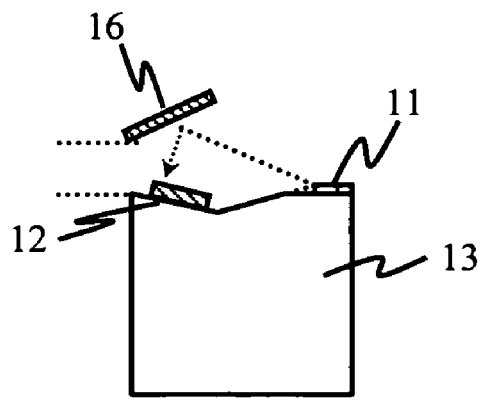

FIGS. 8A through 8C illustrate variations of the main surface shape of the platform substrate. More particularly, FIG. 8A shows a plane main surface of the platform substrate, FIG. 8B shows a main surface having a step, and FIG. 8C shows a main surface having slant surfaces. When the platform substrate 13 has the plane main surface as shown in FIG. 8A, a special process is not performed for the substrate. When the platform substrate 13 has a step on the main surface thereof as shown in FIG. 8B, or when the platform substrate 13 has slant surfaces as shown in FIG. 8C, a given region on the platform substrate 13 is etched to form the given shape, and the LD 11 and the light-receiving element 12 are mounted thereon.

The shape of the platform substrate 13 shown in FIG. 8A does not allow the light emitted to the edge of the light-receiving element 12 to reach the light-receiving portion. In contrast, the shape of the platform substrate 13 shown in FIG. 8B makes it possible to receive the light emitted from the LD 11 to the edge of the light-receiving element shown in FIG. 8A and guide the received light to the light-receiving portion by way of the reflector 16. The shape of the platform substrate 13 shown in FIG. 8C makes it possible to monitor a large amount of light, as compared to the platform substrate 13 shown in FIG. 8A.

The optical module of the present invention does not need the process of adjusting the light-receiving element 12 or the light-receiving portion accurately to a light-emitting direction of the laser light, and does not need a special carrier on the optical module. It is thus possible to simplify the production process of the optical module and lower the cost. The various shapes of the reflector 16 as mentioned before may be arbitrarily combined with the platforms 13 without any specific limitation.

The present invention provides the low-cost module including the LD and the light-receiving element having the incident surface that monitors the optical output from the laser diode, both of which are mounted on the substrate. This object of the present invention is achieved without increasing the number of production processes or the number of component members.

The present invention is not limited to the above-mentioned embodiments, and other embodiments, variations and modifications may be made without departing from the scope of the present invention.

The present invention is based on Japanese Patent Application No. 2004-174804 filed on Jun. 11, 2004, the entire disclosure of which is hereby incorporated by reference.

What is claimed is:

1. An optical module comprising:
a single light-receiving element; and
a reflector composed of multiple wires or ribbons,
the reflector and the single light-receiving element being mounted in the optical module,
the reflector reflecting a light to be received by the single light-receiving element, wherein said multiple wires or ribbons overhang the single light receiving element, wherein the single light-receiving element is mounted on a substrate at a level lower than another level of said substrate at which a light-emitting element that emits the light is mounted.

2. An optical module comprising:
a single light-receiving element; and
a reflector composed of multiple wires or ribbons,
the reflector and the single light-receiving element being mounted in the optical module,
the reflector reflecting a light to be received by the single light-receiving element, wherein said multiple wires or ribbons overhang the single light receiving element, wherein
the optical module has a first mounting surface on which the single light-receiving element is mounted, and a second mounting surface on which a light-emitting element that emits the light is mountable; and
the first and second mounting surfaces form an angle less than 180 degrees.

3. An optical module comprising:
a single light-receiving element; and
a reflector composed of multiple wires or ribbons,
the reflector and the single light-receiving element being mounted in the optical module,
the reflector reflecting a light to be received by the single light-receiving element, wherein said multiple wires or ribbons overhang the single light receiving element, wherein the reflector is fixed in position above the light-receiving element wherein the wire or the ribbon is made of a metal.

4. The optical module as claimed in claim 3, wherein a light-receiving surface of the light-receiving element faces a same direction as a mounting surface of the optical module on which the single light-receiving element is mounted.

5. The optical module as claimed in claim 3, wherein the reflector is provided to intersect with an axis that connects a light-emitting surface of a light-emitting element emitting the light and a light-receiving surface of the single light-receiving element.

6. The optical module as claimed in claim 5, wherein the reflector is provided above the single light-receiving element.

7. The optical module as claimed in claim 3, further comprising a light-emitting element that emits the light.

8. An optical module comprising:
a single light-receiving element; and
a reflector composed of multiple wires or ribbons,
the reflector and the single light-receiving element being mounted in the optical module,
the reflector reflecting a light to be received by the single light-receiving element, wherein said multiple wires or ribbons overhang the single light receiving element, wherein the multiple wires or ribbons of the reflector gradually become lower in height as arranged further from a light-emitting element that is mounted in the optical module and emits the light.

9. The optical module as claimed in claim 8, wherein the reflector has multiple curved ribbons or wires that form a dome or a crescent shape.

10. The optical module as claimed in claim 8, wherein the reflector has a top thereof and is bent from the top.

11. The optical module as claimed in claim 8, wherein the reflector has a portion parallel to a light-receiving surface of the single light-receiving element.

12. An optical module comprising:
a single light-receiving element; and
a reflector composed of multiple wires or ribbons,
the reflector and the single light-receiving element being mounted in the optical module,
the reflector reflecting a light to be received by the single light-receiving element, wherein said multiple wires or ribbons overhang the single light receiving element, wherein each of said multiple ribbons comprises a foil into which thin wires are sewn.

13. A method of manufacturing an optical module comprising:
mounting a single light-emitting element and a single light-receiving element in the optical module; and
forming a reflector by bonding multiple ribbons or multiple wires to overlay the single light-receiving element so that a light emitted from the single light-emitting element may be reflected thereon and guided to a light-receiving surface of the light-receiving element, wherein the reflector is fixed in position above the light-receiving element wherein said multiple wires are secured to a platform substrate by wire-bonding.

14. A method of manufacturing an optical module comprising:
mounting a single light-emitting element and a single light-receiving element in the optical module; and
forming a reflector by bonding multiple ribbons or multiple wires to overlay the single light-receiving element so that a light emitted from the single light-emitting element may be reflected thereon and guided to a light-receiving surface of the light-receiving element, wherein each of said multiple ribbons comprises a foil into which thin wires are sewn.

* * * * *